United States Patent
Nistala et al.

(10) Patent No.: US 11,977,200 B2
(45) Date of Patent: May 7, 2024

(54) SYSTEM AND METHOD FOR REAL-TIME MONITORING AND OPTIMIZING OPERATION OF CONNECTED OIL AND GAS WELLS

(71) Applicant: Tata Consultancy Services Limited, Mumbai (IN)

(72) Inventors: Sri Harsha Nistala, Pune (IN); Tanmaya Singhal, Pune (IN); Venkataramana Runkana, Pune (IN)

(73) Assignee: Tata Consultancy Services Limited, Mumbai (IN)

( * ) Notice: Subject to any disclaimer, the term of this patent is extended or adjusted under 35 U.S.C. 154(b) by 212 days.

(21) Appl. No.: 17/647,299

(22) Filed: Jan. 6, 2022

(65) Prior Publication Data
US 2022/0214474 A1 Jul. 7, 2022

(30) Foreign Application Priority Data
Jan. 7, 2021 (IN) .............................. 202121000786

(51) Int. Cl.
*G01V 20/00* (2024.01)
*E21B 47/008* (2012.01)
(Continued)

(52) U.S. Cl.
CPC ............ *G01V 20/00* (2024.01); *E21B 47/008* (2020.05); *E21B 47/07* (2020.05); *E21B 47/10* (2013.01);
(Continued)

(58) Field of Classification Search
CPC ..... G01V 99/005; E21B 47/008; E21B 47/07; E21B 47/10; E21B 49/00; E21B 2200/20;
(Continued)

(56) References Cited

U.S. PATENT DOCUMENTS

| 11,466,563 | B2* | 10/2022 | Cerraho | G01K 11/32 |
| 2018/0087359 | A1* | 3/2018 | Conn | G05B 13/048 |
| 2020/0132882 | A1* | 4/2020 | Runkana | G06Q 50/02 |

FOREIGN PATENT DOCUMENTS

| CN | 110621846 A * | 12/2019 | E21B 21/08 |
| EP | 1984860 B1 * | 6/2022 | E21B 43/00 |
| WO | WO2021177986 A1 | 9/2021 | |

OTHER PUBLICATIONS

EP-1984860-B1_translated (Year: 2022).*
CN-110621846-A_translated (Year: 2019).*

* cited by examiner

*Primary Examiner* — Manish S Shah
*Assistant Examiner* — Michael J Singletary
(74) *Attorney, Agent, or Firm* — Finnegan, Henderson, Farabow, Garrett & Dunner, LLP

(57) ABSTRACT

It is important to know the flow rates of oil and gas from individual wells in connected oil and gas wells. The existing methods for multiphase flow measurement are prohibitively expensive and used infrequently. The system is configured to ingest real-time and non-real-time data from a plurality of well data sources. Utilizing this data, a plurality of physics-guided data-driven well surveillance models run in real-time for forecasting a plurality of parameters including the flow rates of oil, gas and brine from individual wells, computing the health of well assets and performing fault detection and localization in well assets. The system is also configured to automatically compose a well performance optimization problem based on the current performance of the wells and health of well assets and solve the problem to identify optimal process settings for improving the operation of connected oil and gas wells.

14 Claims, 7 Drawing Sheets

(51) Int. Cl.
  *E21B 47/07* (2012.01)
  *E21B 47/10* (2012.01)
  *E21B 49/00* (2006.01)
  *G06F 30/27* (2020.01)
  *G06Q 10/04* (2023.01)
(52) U.S. Cl.
  CPC ............ *G06F 30/27* (2020.01); *G06Q 10/04* (2013.01); *E21B 49/00* (2013.01); *E21B 2200/20* (2020.05); *E21B 2200/22* (2020.05)
(58) Field of Classification Search
  CPC ...... E21B 2200/22; E21B 43/00; G06F 30/27; G06Q 10/04
  See application file for complete search history.

SYSTEM AND METHOD FOR REAL-TIME MONITORING AND OPTIMIZING OPERATION OF CONNECTED OIL AND GAS WELLS

PRIORITY CLAIM

This U.S. patent application claims priority under 35 U.S.C. § 119 to: Indian Patent Application No. 202121000786, filed on 7 Jan. 2021. The entire contents of the aforementioned application are incorporated herein by reference.

TECHNICAL FIELD

The disclosure herein generally relates to the field of oil and gas production, and, more particularly, to method and system for real-time automatic monitoring and optimizing the operation of connected oil and gas wells.

BACKGROUND

Upstream production of crude oil from oil wells and gas from gas wells and coal bed methane (CBM) or coal seam gas (CSG) wells involves multiple wells/wellheads (e.g., up to 50 wells) which are connected to a common gathering station after which the multiphase mixture of crude oil, gas and water/brine is subjected to various stages of separation. The flow rates of oil, gas, and brine from all wells combined are typically measured only post separation. While multiphase mass flowmeters can provide mass flow rates of oil, gas and brine from each well, they are prohibitively expensive and typically not installed at each wellhead.

Empirical correlations and analytical methods are available for estimating oil/gas flow rates from single wells, but they are not accurate. Virtual flowmeters involving data-driven models have been developed for single oil/gas wells but they are not suitable for connected oil and gas well configurations. Due to this, the flow rates of oil, gas and brine from individual wells in a system of connected oil and gas wells are not known, thereby impacting crude oil and gas production assessments and profitability as some depleted wells may be producing brine beyond profitable threshold levels. This potential revenue leak is more acute in matured fields. Accurate estimates of oil, gas and brine from individual wells are necessary for continuous monitoring, improving the performance of wells and optimizing the production and reducing emissions and cost of operations.

SUMMARY

Embodiments of the present disclosure present technological improvements as solutions to one or more of the above-mentioned technical problems recognized by the inventors in conventional systems. For example, in one embodiment, a system for real-time monitoring and optimizing operation of connected oil and gas wells is provided. The system comprises an input/output interface, one or more hardware processors, and a memory. The memory is in communication with the one or more hardware processors, wherein the one or more first hardware processors are configured to execute programmed instructions stored in the memory, to: receive data related to each well of the connected oil and gas wells from a plurality of data sources; preprocess the received data; soft-sense a set of process variables using the preprocessed data and a set of physics-based soft sensors and models; combine the preprocessed data and the set of process variables to prepare an integrated data; forecast in real-time a plurality of parameters related to each well of the plurality of connected oil and gas wells using a plurality of physics-guided well surveillance models and the integrated data, wherein the plurality of physics-guided well surveillance models is pre-generated offline, and wherein the plurality of parameters comprises: a flow rate of oil, gas and brine produced from each well in the connected oil and gas wells, a pressure, a temperature distribution and a velocity distribution in multiphase flow from each well of the connected oil and gas wells; compute health of a plurality of assets of the connected oil and gas wells using the plurality of physics-guided well surveillance models; compute a planned plurality of parameters related to a production rate of each well using a plurality of physics-based well simulators, wherein the plurality of physics-based well simulators is pre-configured for the connected oil and gas wells; monitor the performance of the each well of the connected oil and gas wells to determine, if the forecasted production is in line with the planned production from each well of the connected oil and gas wells; detect in real-time a production drift based on the monitoring of the performance of the wells; run real-time diagnostics to identify plausible root causes for the detected production drift; compose a well performance optimization problem, wherein the well performance optimization problem comprises of a plurality of operations objectives and constraints in accordance with identified plausible root causes of the detected drift and the computed health of the plurality of assets of the connected oil and gas wells; and identify a plurality of process settings for optimal operation of the connected oil and gas wells by solving the composed well performance optimization problem.

In another aspect, a method for real-time monitoring and optimizing the operation of connected oil and gas wells is provided. Initially data related to each well of the connected oil and gas wells is received from a plurality of data sources. The received data is then preprocessed. In the next step, a set of process variables is soft-sensed using the preprocessed data and a set of physics-based soft sensors and models. The preprocessed data and the set of process variables are then combined to prepare an integrated data. In the next step, a plurality of parameters related to each well of the plurality of connected oil and gas wells is forecasted in real-time using a plurality of physics-guided well surveillance models and the integrated data, wherein the plurality of physics-guided well surveillance models is pre-generated offline, wherein the plurality of parameters comprises: a flow rate of oil, gas and brine produced from each well in the connected oil and gas wells, a pressure, a temperature distribution and a velocity distribution in multiphase flow from each well of the connected oil and gas wells. In the next step, health of a plurality of assets of the connected oil and gas wells is computed using the plurality of physics-guided well surveillance models. Further, a planned plurality of parameters related to a production rate of each well is also computed using a plurality of physics-based well simulators, wherein the plurality of physics-based well simulators is pre-configured for the connected oil and gas wells. In the next step, the performance of the each well of the connected oil and gas wells is monitored to determine, if the forecasted production is in line with the planned production from each well of the connected oil and gas wells. A production drift is then detected based on the monitoring of the performance of the wells. In the next step, real-time diagnostics is run to identify plausible root causes for the detected drift. Further a well performance optimization problem is composed, wherein the well performance optimization problem comprises of a plurality of operations objectives and constraints in accordance with identified plausible root causes of the detected production drift and the computed health of the plurality of assets of the connected oil and gas wells. And finally, a plurality of process settings is identified for optimal operation of the connected oil and gas wells by solving the composed well performance optimization problem.

In yet another aspect, one or more non-transitory machine-readable information storage mediums comprising one or more instructions which when executed by one or more hardware processors cause real-time monitoring and optimizing the operation of connected oil and gas wells is provided. Initially data related to each well of the connected oil and gas wells is received from a plurality of data sources. The received data is then preprocessed. In the next step, a set of process variables is soft-sensed using the preprocessed data and a set of physics-based soft sensors and models. The preprocessed data and the set of process variables are then combined to prepare an integrated data. In the next step, a plurality of parameters related to each well of the plurality of connected oil and gas wells is forecasted in real-time using a plurality of physics-guided well surveillance models and the integrated data, wherein the plurality of physics-guided well surveillance models is pre-generated offline, wherein the plurality of parameters comprises: a flow rate of oil, gas and brine produced from each well in the connected oil and gas wells, a pressure, a temperature distribution and a velocity distribution in multiphase flow from each well of the connected oil and gas wells. In the next step, health of a plurality of assets of the connected oil and gas wells is computed using the plurality of physics-guided well surveillance models. Further, a planned plurality of parameters related to a production rate of each well is also computed using a plurality of physics-based well simulators, wherein the plurality of physics-based well simulators is pre-configured for the connected oil and gas wells. In the next step, the performance of the each well of the connected oil and gas wells is monitored to determine, if the forecasted production is in line with the planned production from each well of the connected oil and gas wells. A production drift is then detected based on the monitoring of the performance of the wells. In the next step, real-time diagnostics is run to identify plausible root causes for the detected drift. Further a well performance optimization problem is composed, wherein the well performance optimization problem comprises of a plurality of operations objectives and constraints in accordance with identified plausible root causes of the detected production drift and the computed health of the plurality of assets of the connected oil and gas wells. And finally, a plurality of process settings is identified for optimal operation of the connected oil and gas wells by solving the composed well performance optimization problem.

It is to be understood that both the foregoing general description and the following detailed description are exemplary and explanatory only and are not restrictive of the invention, as claimed.

BRIEF DESCRIPTION OF THE DRAWINGS

The accompanying drawings, which are incorporated in and constitute a part of this disclosure, illustrate exemplary embodiments and, together with the description, serve to explain the disclosed principles.

DETAILED DESCRIPTION

Exemplary embodiments are described with reference to the accompanying drawings. In the figures, the left-most digit(s) of a reference number identifies the figure in which the reference number first appears. Wherever convenient, the same reference numbers are used throughout the drawings to refer to the same or like parts. While examples and features of disclosed principles are described herein, modifications, adaptations, and other implementations are possible without departing from the scope of the disclosed embodiments.

Figure 1:
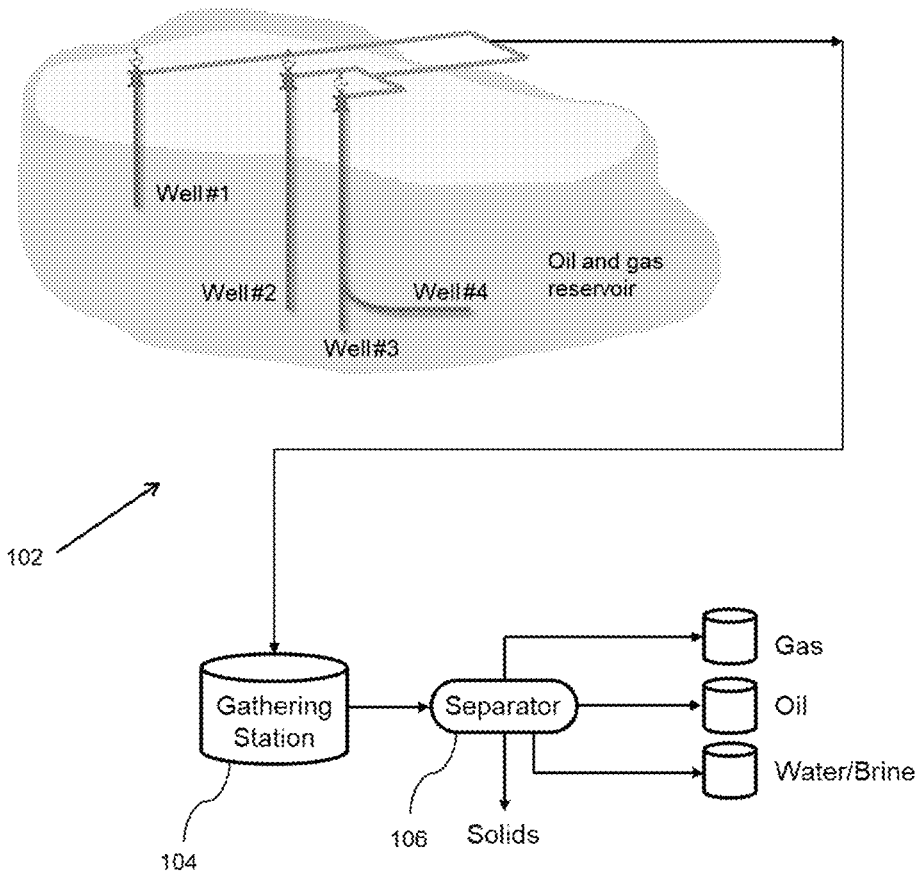
FIG. 1 is a schematic block diagram of an oil and gas reservoir and associated production unit according to some embodiments of the present disclosure.

A schematic block diagram of an oil and gas production facility 102 present at an oil and gas reservoir site is shown in FIG. 1. The figure shows multiple wells (vertical as well as horizontal) configured to extract oil/gas from the subsurface reservoir. In the present example, four wells are shown. The wellheads are connected to a common gathering header. A multiphase mixture of oil, gas and water/brine extracted from these wells is collected at a gathering station 104. From the gathering station 104, the mixture is passed through a separator 106 for further separation into oil, gas, water/brine, and solids, if any. It is important to know the flow rates of oil and gas from individual wells for monitoring and optimizing the operation of networked oil and gas wells.

There are few methods for measuring the flowrates of the oil and/or gas coming out of the wells. Multi-phase mass flowmeters, installed on each wellhead, can be used to measure the mass flow rates of oil, gas, and brine from each well. However, measurements using multiphase flow meters that are commonly based on neutron detection using gamma rays are prohibitively expensive and the meters cannot be used continuously. To address this, data-driven models for estimating flow rates of oil/gas from individual wells (known as virtual flowmeters) have been developed and are shown to have a fair degree of accuracy. However, such virtual flowmeters are developed using infrequent production flow rate measurements and do not lead to models with a good degree of accuracy. Further, they are developed only for single wells and cannot be directly applied to connected oil and gas wells. Predictions from all the single well models often do not add up to the total measured flow rates of oil and gas as each model is trained separately. Also, due to the dynamic and unpredictable nature of sub surface conditions of each well, the data-driven models must be re-calibrated/re-tuned periodically to maintain their performance and accuracy.

Secondly, production engineers rely on pressure and temperature measurements of the wells and physics-based models of the reservoirs/wells (e.g., reservoir simulators, well flow simulators, nodal analysis, etc.) to judge the performance of individual wells, identify sub-par production zones and take corrective actions (e.g. artificial lift, fluid injection, etc.). Given the complex and unpredictable nature of well production, these corrective actions are experience-driven and largely depend on the engineer's individual understanding of well behavior and operation. In the absence of a central advisory/recommender system, the corrective actions taken vary significantly from engineer to engineer resulting in sub-optimal operation of connected wells, large variations in the amounts of produced crude/gas and deviations from planned production rates.

Referring now to the drawings, and more particularly to FIG. 1 through FIG. 6, where similar reference characters denote corresponding features consistently throughout the figures, there are shown preferred embodiments and these embodiments are described in the context of the following exemplary system and/or method.

Figure 2:
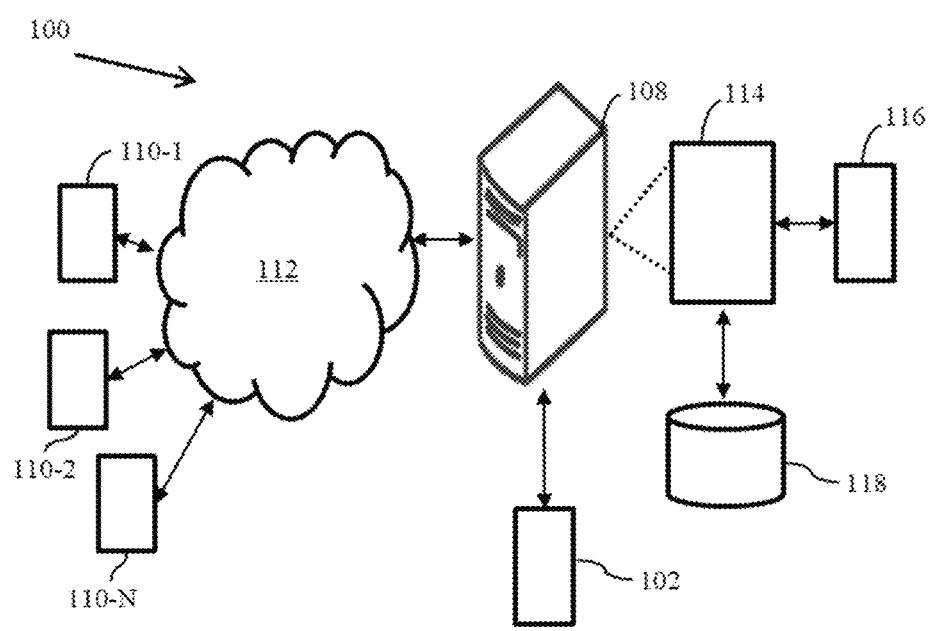
FIG. 2 illustrates a network diagram of a system for real-time monitoring and optimizing the operation of connected oil and gas wells according to some embodiments of the present disclosure.
Figure 3:
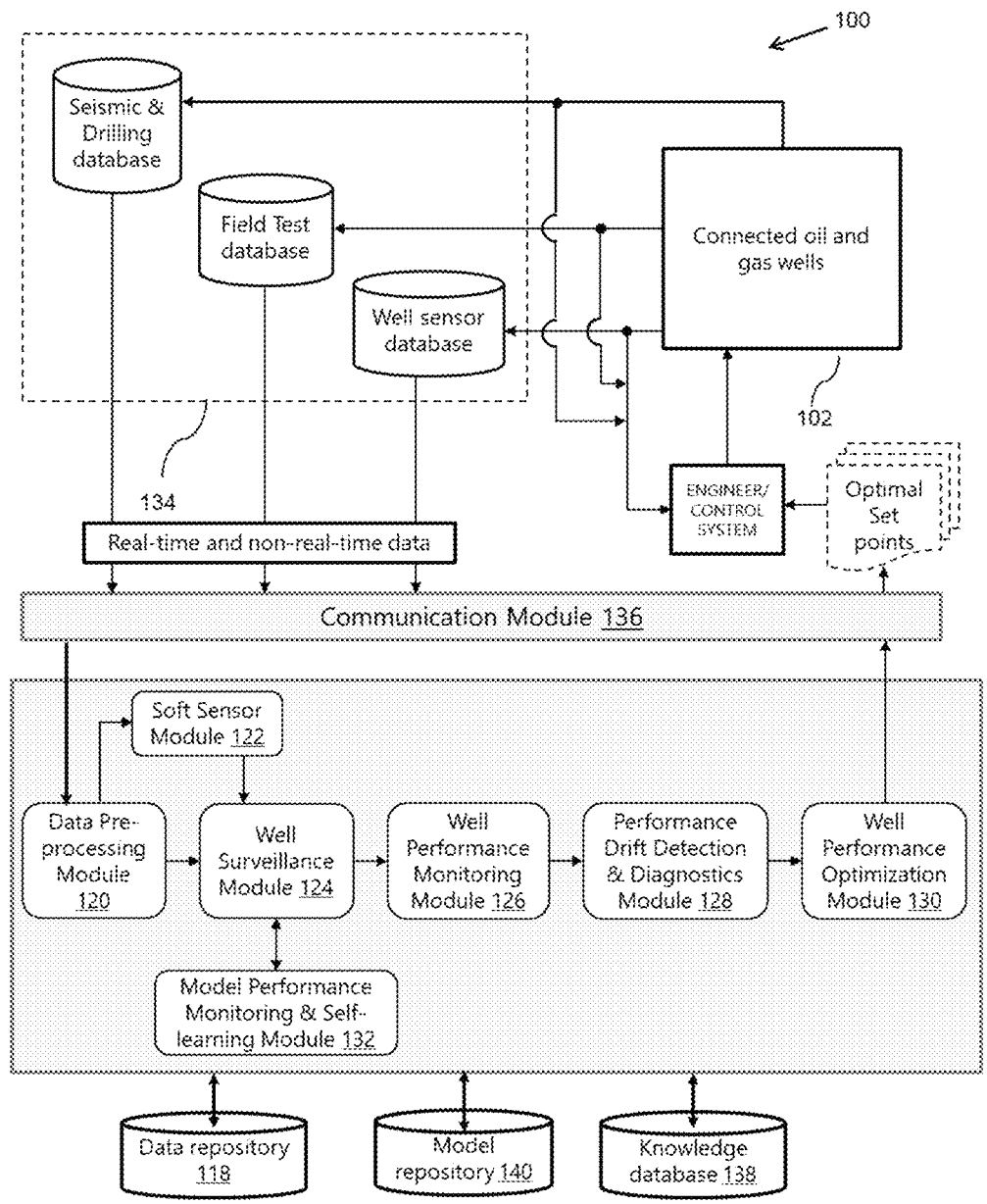
FIG. 3 is a functional block diagram of the system for real-time monitoring and optimizing the operation of connected oil and gas wells according to some embodiments of the present disclosure.

FIG. 2 illustrates a block diagram of a system 100 for real-time monitoring and optimizing the operation of the connected oil and gas wells. FIG. 3 shows a schematic block diagram of the system 100 for real-time monitoring and optimizing operation of the connected oil and gas wells. The system 100 is configured to ingest real-time and non-real-time data from a plurality of data sources 134 such as well sensor database/historian, field test database, seismic and drilling database, etc. Utilizing this data, a plurality of well surveillance models can run in real-time in conjunction with available physics-based models of the connected oil and gas wells. The plurality of well surveillance models includes data-driven models for estimating and forecasting the flow rates of oil, gas and brine, and the pressure, temperature, and velocity distributions in multiphase flow from each well, computing the health of well assets such as choke control valves and artificial lift equipment (electrical submersible pumps, progressive cavity pumps, etc.), and performing fault detection and localization in well assets.

The system 100 comprises physics-guided development and re-learning of data-driven well surveillance models (for estimating flow rates of oil and gas) by incorporating material balance constraints and equations related to relevant physical phenomena such as fluid flow in wells, saturation of phases and capillary pressure. The system 100 is also configured for real-time automatic monitoring of the performance of connected wells, identification of deviations/performance drifts with respect to planned production rates, diagnosing the root causes of such drifts, and identification and recommendation of optimal settings for improving crude oil and/or gas production, decreasing energy consumption and emissions, and improving the overall profitability considering sales and transport constraints, equipment availability and injectant constraints.

Although the present disclosure is explained considering that the system 100 is implemented on a server, it may also be present elsewhere such as a local machine. It may be understood that the system 100 comprises one or more computing devices 108, such as a laptop computer, a desktop computer, a notebook, a workstation, a cloud-based computing environment and the like. It will be understood that the system 100 may be accessed through one or more input/output interfaces collectively referred to as I/O interface 110. Examples of the I/O interface 110 may include, but are not limited to, a user interface, a portable computer, a personal digital assistant, a handheld device, a smartphone, a tablet computer, a workstation and the like. The I/O interface 110 are communicatively coupled to the system 100 through a network 112.

In an embodiment, the network 112 may be a wireless or a wired network, or a combination thereof. In an example, the network 112 can be implemented as a computer network, as one of the different types of networks, such as virtual private network (VPN), intranet, local area network (LAN), wide area network (WAN), the internet, and such. The network 112 may either be a dedicated network or a shared network, which represents an association of the different types of networks that use a variety of protocols, for example, Hypertext Transfer Protocol (HTTP), Transmission Control Protocol/Internet Protocol (TCP/IP), and Wireless Application Protocol (WAP), to communicate with each other. Further, the network 112 may include a variety of network devices, including routers, bridges, servers, computing devices, storage devices. The network devices within the network 112 may interact with the system 100 through communication links.

The system 100 may be implemented in a workstation, a mainframe computer, a server, and a network server. In an embodiment, the computing device 108 further comprises one or more hardware processors 114, one or more memory 116, hereinafter referred as a memory 116 and a data repository 118, for example, a repository 118 or a database 118. The memory 116 is in communication with the one or more hardware processors 114, wherein the one or more hardware processors 114 are configured to execute programmed instructions stored in the memory 116, to perform various functions as explained in the later part of the disclosure. The repository 118 may store data processed, received, and generated by the system 100.

The system 100 supports various connectivity options such as BLUETOOTH®, USB, ZigBee and other cellular services. The network environment enables connection of various components of the system 100 using any communication link including Internet, WAN, MAN, and so on. In an exemplary embodiment, the system 100 is implemented to operate as a stand-alone device. In another embodiment, the system 100 may be implemented to work as a loosely coupled device to a smart computing environment. The components and functionalities of the system 100 are described further in detail.

According to an embodiment of the disclosure, the memory 116 further comprises a plurality of units or plurality of modules. The plurality of units is configured to perform various functions. The plurality of units comprises a data preprocessing module 120, a soft sensor module 122, a well surveillance module 124, a well performance monitoring module 126, a performance drift detection and diagnostics module 128, a well performance optimization module 130, and a model performance monitoring and self-learning module 132.

According to an embodiment of the disclosure, an input data is collected from a plurality of data sources 134. The input data comprises data related to each well of the connected oil and gas wells as well as the reservoir from a plurality of data sources 134. The plurality of data sources 134 comprises one or more of comprises a distributed control system (DCS), one or more of Supervisory Control and Data Acquisition (SCADA) System, Enterprise Resource Planning (ERP) system, a historian, a laboratory information management system (LIMS), Manufacturing Execution System (MES), Manufacturing Operations Management System (MOM), databases, a plurality of sensors, external sources, manual input and other digital systems in the process plant. The data can also be entered manually by the user/operator using the I/O interface 104. The data can also be collected from a plurality of sensors and instruments installed for sensing specific operating conditions. This data and the historical data accumulated over a period of time in a data historian is connected to the real-time monitoring and optimizing system for connected wells (on edge/cloud) through a communication interface. According to an embodiment of the disclosure, the plurality of data sources 134 may comprise of information/data related to products and byproducts (crude oil, gas, brine, condensate, etc.), well performance, maintenance information, design information, equipment information, predictive models, optimization models, operations data, processed data, recommendations/decisions from the system, environmental parameters and expert knowledge among others.

According to an embodiment of the disclosure, the monitoring and optimizing system for connected oil and gas wells is connected to the oil and gas production facility 102 through a communication module 136. The communication module 136 is also configured to convey information related to drifts in well performance and probable root causes of detected drifts, and the optimal settings for operating the connected wells to the field engineers and/or remote control room. The data pre-processing module 120 is configured to cleanse the received data for further analysis, and consists of reducing noise, removing outliers and spurious values from the data, achieving a uniform sampling frequency by up-sampling or down-sampling various variables, and imputation of missing values in the available data. It is also configured to perform the steps of synchronization of data from various data sources by incorporating appropriate process lags and residence times in various storage facilities, and integration of data from various data sources using appropriate logic (e.g., integrating based on timestamp of each data source).

According to an embodiment of the disclosure, the system 100 comprises the soft sensor module 122. The soft sensor module is configured to soft-sense a set of process variables using preprocessed data and a set of physics-based soft sensors and models. The soft sensor module 122 is configured to compute parameters related to the behavior of the connected wells and their operation using engineering formulae and physics-based models such as reservoir simulators, well flow simulators, nodal analysis, etc. as known in the art. Examples of such engineering formulae and physics-based models shall not be construed as limiting the scope of the present disclosure.

According to an embodiment of the disclosure, the system 100 comprises the well surveillance module 124. The well surveillance module 124 is configured to estimate the current values and forecast in real-time a plurality of parameters related to each well of the plurality of connected oil and gas wells using a plurality of physics-guided well surveillance models and an integrated data. The integrated data is formed by combining the preprocessed data and the set of soft-sensed process variables. The plurality of physics-guided well surveillance models is pre-generated offline. Though initially, the generation of the plurality of physics-guided well surveillance models is one time process, but the plurality of physics-guided well surveillance models can be retuned as and when necessary. The plurality of forecasted parameters comprises: a mass flow rate of oil, gas and brine coming out from each well of the connected oil and gas wells, a pressure and temperature, and velocity distribution in the multiphase flow from each well of the connected oil and gas wells.

The plurality of physics-guided well surveillance models is also configured to compute and monitor the real-time health of well and wellhead assets and perform real-time fault detection and fault localization of a plurality of the assets of the connected oil and gas wells. The well and wellhead assets include such as choke control valves, and artificial lift equipment (electrical submersible pumps, progressive cavity pumps, etc.).

According to an embodiment of the disclosure, the system 100 is also configured to compute a planned plurality of parameters related to a production rate of crude oil and/or gas of each well using a plurality of physics-based well simulators. The plurality of physics-based well simulators is pre-configured for oil and gas wells in a specific reservoir.

Figure 6:
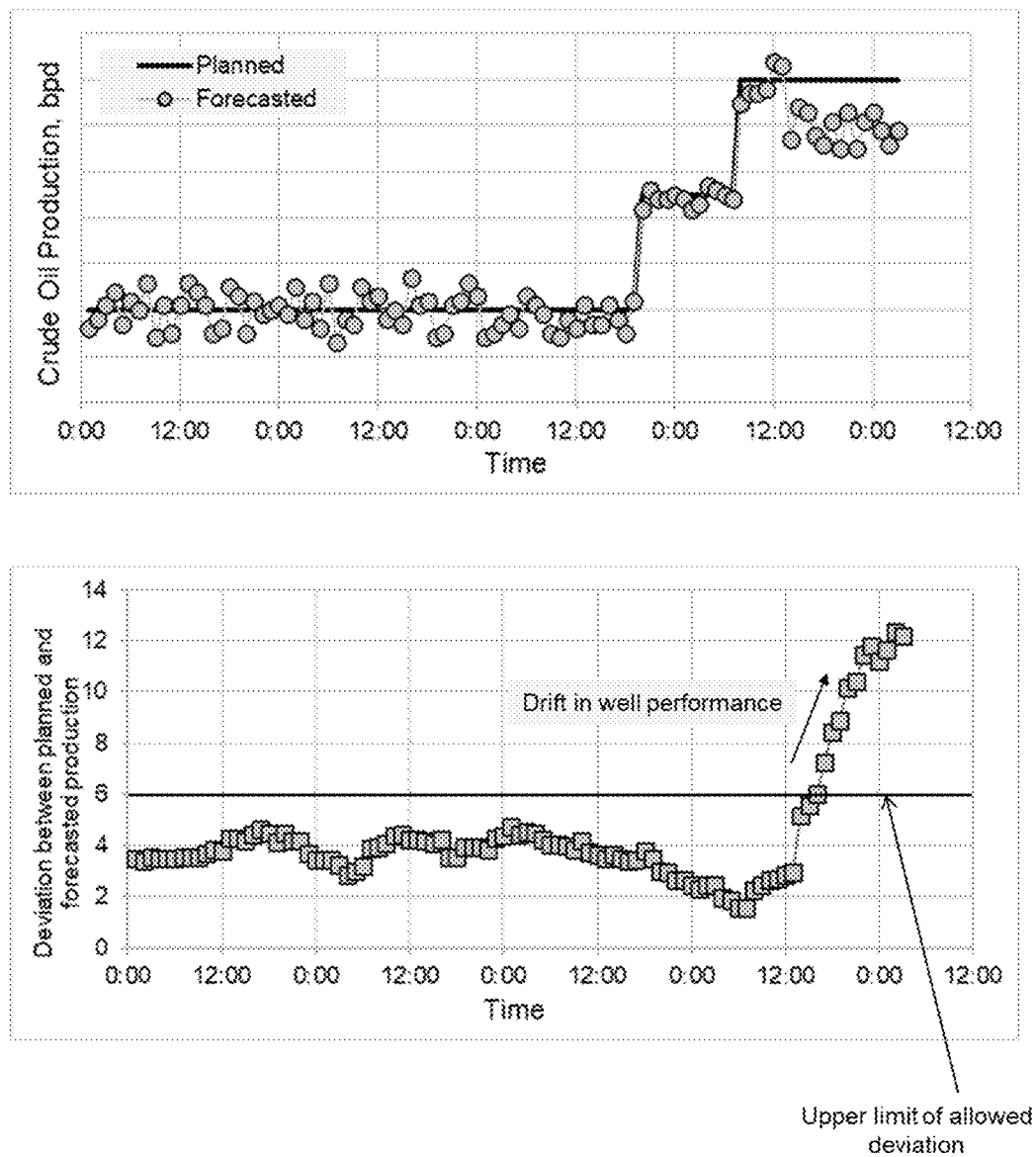
FIG. 6 is a graphical representation of trends of planned and forecasted crude oil flow rate from one of the wells in the connected oil and gas wells according to some embodiments of the present disclosure.

According to an embodiment of the disclosure, the well performance monitoring module 126 is configured to monitor the performance of the each well of the connected oil and gas wells to determine, if the estimated and forecasted mass flow rates of oil and gas from the well surveillance module 124 are in line with the planned production rates from each well of the connected oil and gas wells. Monitoring the performance of the oil and gas wells is accomplished by computing a measure of deviation between the planned and forecasted flow rates of oil and gas using one or more statistical measures such as mean absolute error (MAE), root mean square error (RMSE) and mean absolute percentage error (MAPE). Trends of typical planned and forecasted crude oil flow rate from one of the wells in a connected oil and gas wells are depicted in FIG. 6. The deviation between planned and forecasted oil flow rate, estimated in terms of RMSE, is also depicted in the figure.

According to an embodiment of the disclosure, the performance drift detection and diagnostics module 128 is configured to detect any drifts in real time in the expected performance of the wells in real-time based on the monitoring of the performance of the wells. In FIG. 6, a drift in the performance of one of the wells in detected when the deviation between planned and forecasted crude oil production crossed the upper limit of allowed deviation. Further, the performance drift and diagnostics module 128 is also configured to run real-time diagnostics to identify plausible root causes for such a drift (e.g., sensor malfunction, changes in reservoir conditions, insufficient injectant flow rate, faults in wellhead assets, etc.). Real-time diagnostics of performance drift is performed using data-driven diagnostic models built using one or more of the statistical and machine learning techniques including principal component analysis, Mahalanobis distance, isolation forest, random forest classifiers, one-class and multiclass support vector machine, artificial neural networks and its variants, elliptic envelope and auto-encoders (e.g. dense auto-encoders, LSTM auto-encoders). Pre-populated knowledge pertaining to common process and equipment faults in connected oil and gas wells and historical maintenance information stored in the knowledge database 138 is also utilized for real-time diagnostics.

According to an embodiment of the disclosure, the well performance optimization module 130 is configured to compose, a well performance optimization problem. The well performance optimization problem comprising of a plurality of operations objectives and constraints in accordance with identified plausible root causes of the detected drift and the computed health of the plurality of assets of the connected oil and gas wells. The objectives and constraints of the optimization problem are automatically identified based on the historical information of performance drifts available in the knowledge database 138 and can be modified by the engineers as necessary. Typical operations objectives include maximizing crude oil and gas production, minimizing injectant amounts, decreasing energy consumption and emissions associated with operations, and improving the overall profitability of the connected oil and gas well network. Typical constraints include market demand for oil and gas, transport limits, availability of well heads, operational limits imposed by health of well assets and injectant system constraints. The well performance optimization module 130 automatically identifies a plurality of settings for optimal operation of the connected oil and gas wells by solving the composed well performance optimization problem using the forecasting models and optimization techniques such as genetic algorithms, particle swarm optimization, sequential quadratic programming, etc. Thus, the well performance optimization module 130 identifies suitable operations objectives and constraints and performs model-based process optimization to identify optimal process settings that can be informed to the engineers. Optimal process settings are identified for each well and include choke valve positions, set points for injectant systems (e.g. amount of injectant to be used), setpoints for artificial lift systems (e.g. electrical submersible pumps (ESPs), progressive capacity pump (PCPs)), etc. Optimal settings can be recommended to the engineers in real-time/near-real-time to assist them in taking proactive corrective actions. The recommendations can also be implemented automatically to achieve closed-loop control of well operations.

According to an embodiment of the disclosure, the model performance monitoring and self-learning module 132 is configured to monitor performance of all well surveillance models in real-time using actual measurements, whenever available, to detect drifts/drop in accuracy and to re-tune/re-calibrate the models automatically to maintain their performance and accuracy. The flow rates of oil, gas and brine from individual wells forecasted by the well surveillance models will be compared with actual measurements during field tests (whenever they are conducted) to compute a model quality index (MQI) for the well surveillance models. MQI is computed using one or more of the following metrics: mean absolute error (MAE), root mean square error (RMSE), mean absolute percentage error (MAPE) and hit rate (percentage of values within ±α% error) and coefficient of determination ($R^2$). MQI for the well surveillance models is computed in real-time by considering the forecasted and actual measurements available in a time window of a predetermined duration (e.g. 8 hours) and sliding the time window as time progresses. The model performance monitoring and self-learning module 132 is configured to monitor the computed MQI values and trigger self-learning of the well surveillance models when the computed MQI falls below a predetermined threshold for a predetermined amount of time (e.g. 1 hour). Self-learning is performed using the historical as well as the latest available data from all the data sources to improve the MQI of the well surveillance models above the predetermined threshold. This is accomplished by re-training the well surveillance models by tuning the weights and hyperparameters in the models, modifying the machine learning technique used in the models and changing the features used in the models. The model performance monitoring and self-learning module is also configured to activate the self-learnt models with improved MQI for predictions.

Figure 4:
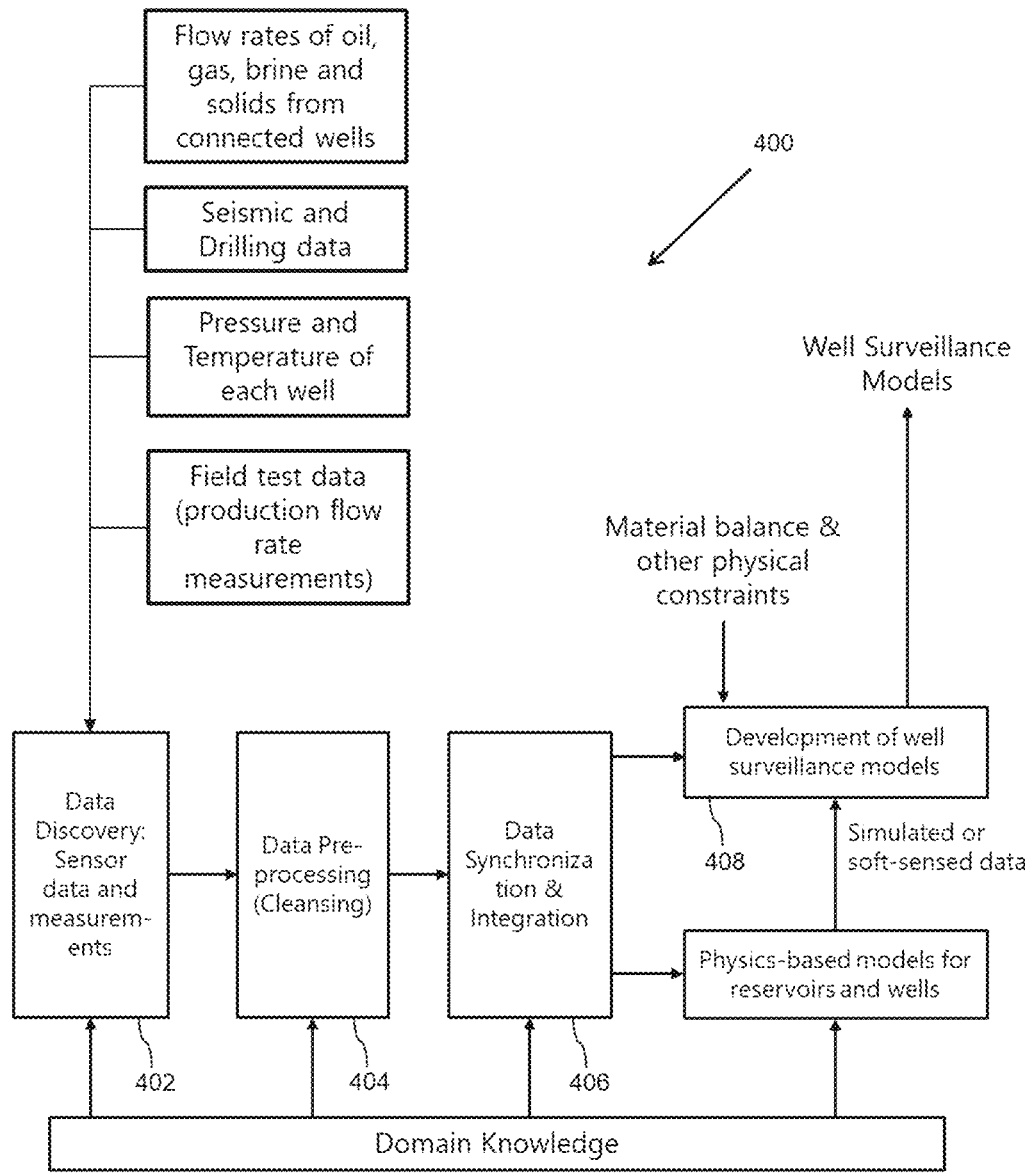
FIG. 4 is a flow diagram illustrating method for developing physics-guided well surveillance models for real-time monitoring and optimizing operation of connected oil and gas wells in accordance with some embodiments of the present disclosure.

A method 400 for development of the well surveillance models is schematically depicted in FIG. 4. The method comprises of the following steps:

At step 402, data discovery is performed to identify the availability, sampling/recording frequency and quality of sensor data and measurements that are available for wells and wellheads. Some of the data from various data sources includes:
- Pressure and temperature data of each well available at regular intervals and the mass flow rates of oil, gas, brine and solids at the end of the separation step for all wells combined.
- Intermittent measurements of oil, gas and brine flow rates from field tests on some or all of the wells.
- Reservoir pressure and temperature available from production logging tests (PLT) conducted periodically.
- Reservoir condition information obtained from PVT (Pressure, Volume and Temperature) analysis. It involves taking a downhole sample (existing in situ at ~2500 to 5000 psi and >100° C.) and subjecting it to various pressures and temperatures to understand its behavior as a fluid as it moves up to the surface (e.g. liquids that condense at surface pressure, etc.).
- 4D seismic data of the reservoir and drilling data of the wells that is leveraged to correct the downhole pressure conditions and identify wells that are closer to water cut, i.e., likely to have more brine in the mix.

At step 404, historical data from all the data sources is preprocessed to cleanse the data. This consists of reducing noise, removing outliers and spurious values, achieving a uniform sampling frequency, and imputation of missing values in the data.

At step 406, preprocessed data from various data sources is synchronized by incorporating appropriate process and residence time lags. Data from various data sources is then integrated using appropriate logic to prepare the integrated data that will be utilized for model development.

At step 408, the well surveillance models are developed. In this step, physics-based models (e.g., reservoir simulators, well/flow simulators, nodal analysis, etc.), if available, are used to augment the integrated data with simulated/soft-sensed data to improve the accuracy of well surveillance models. Integrated data along with soft-sensed data is used to build data-driven models for well surveillance. The models are used for predicting the current values and forecasting the future values of flow rates of oil, gas and brine, and pressure, temperature and velocity distributions of multiphase from each well in the connected oil and gas wells. They are also used for estimating and monitoring the health of well and wellhead assets such as choke values and artificial lift equipment and performing real-time fault detection and localization based on the estimated health of the assets.

Models for forecasting the well performance are physics-guided artificial neural network (ANN) models that incorporate the physics-based model equations corresponding to multiphase flow in the wells: saturation balance of each phase, capillary pressures, multiphase flow (e.g. Darcy's law), overall mass balance of each phase and component (hydrocarbon) balances. The model equations are combined with neural network architectures in of one of the following configurations: output of the physics-based model equations used as inputs to the ANN model along with other well sensors and measurements data, physics-based model equations used in the loss function of the ANN model as a regularization term and outputs of the physics-based model and embeddings from the ANN model used in another neural network. The ANNs used in the well surveillance models include multilayer perceptron and recurrent neural network and its variants such as long short term memory (LSTMs) networks and gated recurrent units (GRUs). Models for estimating the health of well and wellhead assets are built using one or more of the statistical and machine learning techniques including principal component analysis, Mahalanobis distance, isolation forest, random forest classifiers, one-class or multiclass support vector machine, artificial neural networks and its variants, elliptic envelope and auto-encoders (e.g. dense auto-encoders, LSTM auto-encoders).

The system 100 comprises a knowledge database 138 to capture, reuse and update the knowledge derived from historical data as well as operations and maintenance knowledge available with operators, maintenance engineers, geologists and other experts to contextualize and make the activities of well performance monitoring, diagnostics and optimization knowledge-assisted or knowledge-guided. The system 100 also comprises a model repository 140 for storing and retrieving the relevant models and soft sensors for well surveillance, well performance monitoring, and performance drift detection and diagnostics as well as the composed optimization problems.

Figure 5A:
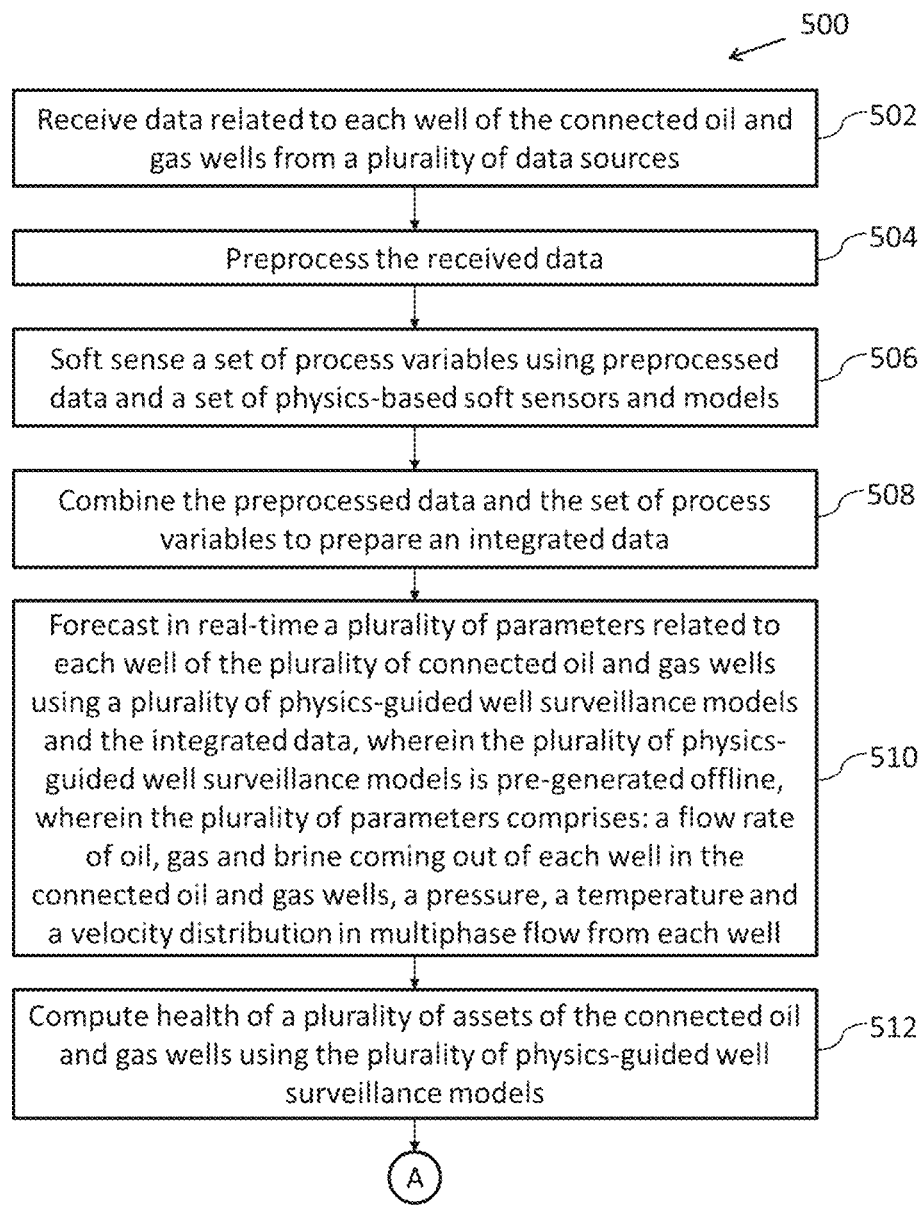
FIG. 5A-5B is a flowchart illustrating a method for real-time monitoring and optimizing the operation of connected oil and gas wells in accordance with some embodiments of the present disclosure.
Figure 5B:
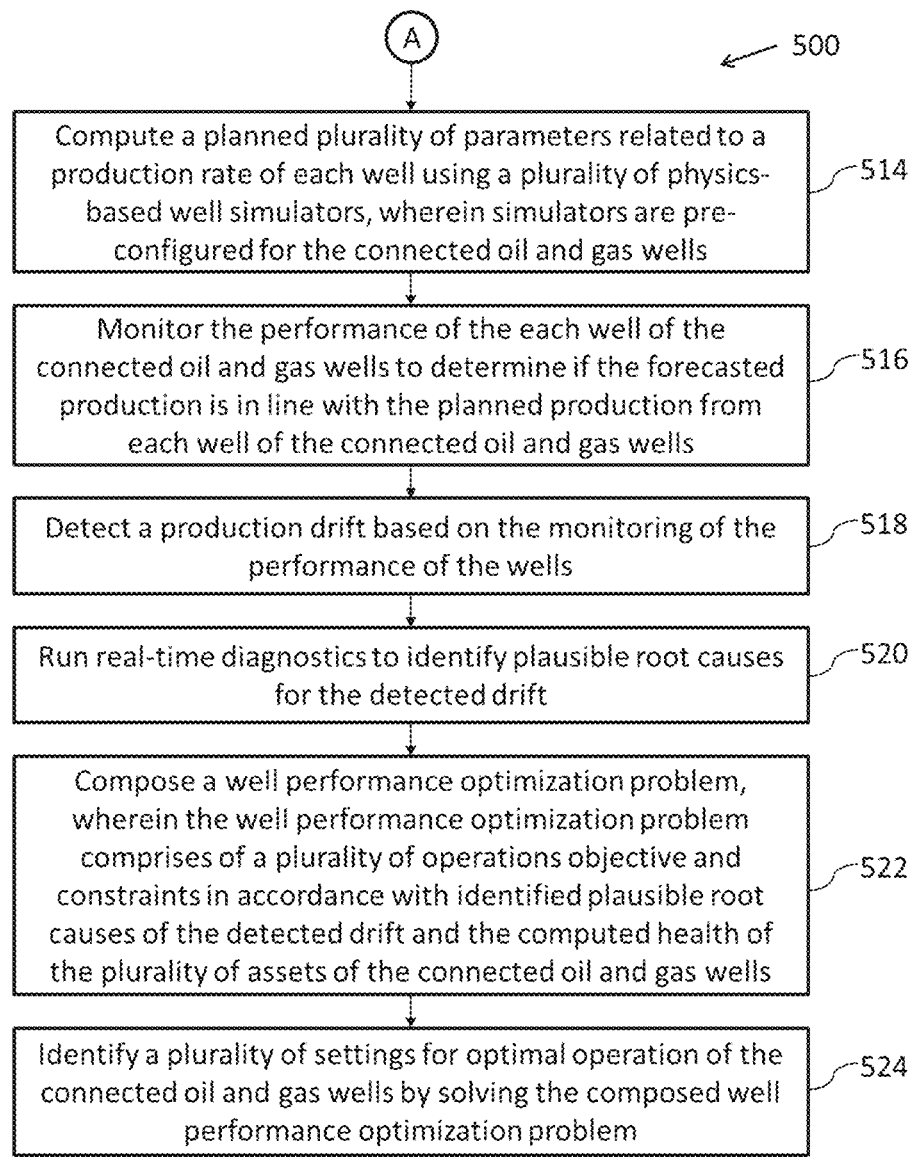

In operation, referring to FIG. 5A-5B, flow diagram of a method 500 for real-time monitoring and optimizing the operation of connected oil and gas wells, is described in accordance with an example embodiment. The method 500 depicted in the flow chart may be executed by a system, for example, the system, 100 of FIG. 1. In an example embodiment, the system 100 may be embodied in the computing device as explained above.

Operations of the flowchart, and combinations of operation in the flowchart, may be implemented by various means, such as hardware, firmware, processor, circuitry and/or other device associated with execution of software including one or more computer program instructions. For example, one or more of the procedures described in various embodiments may be embodied by computer program instructions. In an example embodiment, the computer program instructions, which embody the procedures, described in various embodiments may be stored by at least one memory device of a system and executed by at least one processor in the system. Any such computer program instructions may be loaded onto a computer or other programmable system (for example, hardware) to produce a machine, such that the resulting computer or other programmable system embody means for implementing the operations specified in the flowchart. It will be noted herein that the operations of the method 500 are described with help of system 100. However, the operations of the method 500 can be described and/or practiced by using any other system.

Initially at step 502 of the method 500, data related to each well of the connected oil and gas wells is received from the plurality of data sources 134. In the next step 504, the received data is preprocessed. Further at step 506, a set of process variables is soft-sensed using the preprocessed data and a set of physics-based soft sensors or models. At step 508, the preprocessed data and the set of process variables are then combined to prepare the integrated data.

In the next step 510, a plurality of parameters related to each well of the plurality of connected oil and gas wells is forecasted in real-time using the plurality of physics-guided well surveillance models and the integrated data, wherein the plurality of physics-guided well surveillance models is pre-generated offline. Though initially the plurality of physics-guided well surveillance model generation is a one-time process, but later plurality of physics-guided well surveillance model can be retrained or retuned whenever there is a performance drop. The plurality of parameters comprises: a flow rate of oil, gas and brine coming out of each well in the connected oil and gas wells, a pressure, temperature distribution and velocity distribution in the multiphase flow from each well of the connected oil and gas wells.

In the next step 512, health of the plurality of assets of the connected oil and gas wells is computed using the plurality of physics-guided well surveillance models. Further at step 514, the planned plurality of parameters related to a production rate of each well is computed using a plurality of physics-based well simulators, wherein the plurality of physics-based well simulators is pre-configured for oil and gas wells in a specific reservoir. Further at step 516, the performance of the each well of the connected oil and gas wells is monitored to determine if the forecasted production is in line with the planned production from each well of the connected oil and gas wells. In the next step 518, a production drift is detected in real-time based on the monitoring of the performance of the wells. Further at step 520, real-time diagnostics are run to identify plausible root causes for the detected drift.

In the next step 522, the well performance optimization problem is composed. The well performance optimization problem comprises of the plurality of operations objectives and constraints in accordance with identified plausible root causes of the detected drift and the computed health of the plurality of assets of the connected oil and gas wells. The well optimization problem is composed utilizing the pre-generated knowledge database 138. And finally, at step 524, the plurality of settings is identified for optimal operation of the connected oil and gas wells by solving the composed well performance optimization problem.

It should be appreciated that the plurality of units can work in online or offline mode as per the requirement. Some of the units may operate online in the background or some may work online in real-time. This system 100 can be applied to connected crude oil wells and natural gas wells in crude oil reservoirs as well as natural gas/methane wells in coal seams. The system 100 may also include reinforcement learning techniques for optimal control. The well surveillance models could interface with external models/tools, may receive inputs/outputs and may iterate over them. The plurality of units is supported by an interactive user interface that can be used to provide external inputs, receive outputs/recommendations, and visualizations of generated outputs and recommendations.

The written description describes the subject matter herein to enable any person skilled in the art to make and use the embodiments. The scope of the subject matter embodiments is defined by the claims and may include other modifications that occur to those skilled in the art. Such other modifications are intended to be within the scope of the claims if they have similar elements that do not differ from the literal language of the claims or if they include equivalent elements with insubstantial differences from the literal language of the claims.

The embodiments of present disclosure herein address unresolved problem of estimation of flow rates of oil and gas involved in the monitoring and performance optimization of connected oil and gas wells. The embodiment, thus provides a method and system for real-time monitoring and optimizing the operation of connected oil and gas wells It is to be understood that the scope of the protection is extended to such a program and in addition to a computer-readable means having a message therein; such computer-readable storage means contain program-code means for implementation of one or more steps of the method, when the program runs on a server or mobile device or any suitable programmable device. The hardware device can be any kind of device which can be programmed including e.g. any kind of computer like a server or a personal computer, or the like, or any combination thereof. The device may also include means which could be e.g. hardware means like e.g. an application-specific integrated circuit (ASIC), a field-programmable gate array (FPGA), or a combination of hardware and software means, e.g. an ASIC and an FPGA, or at least one microprocessor and at least one memory with software processing components located therein. Thus, the means can include both hardware means and software means. The method embodiments described herein could be implemented in hardware and software. The device may also include software means. Alternatively, the embodiments may be implemented on different hardware devices, e.g. using a plurality of CPUs.

The embodiments herein can comprise hardware and software elements. The embodiments that are implemented in software include but are not limited to firmware, resident software, microcode, etc. The functions performed by various components described herein may be implemented in other components or combinations of other components. For the purposes of this description, a computer-usable or computer readable medium can be any apparatus that can comprise, store, communicate, propagate, or transport the program for use by or in connection with the instruction execution system, apparatus, or device.

The illustrated steps are set out to explain the exemplary embodiments shown, and it should be anticipated that ongoing technological development will change the manner in which particular functions are performed. These examples are presented herein for purposes of illustration, and not limitation. Further, the boundaries of the functional building blocks have been arbitrarily defined herein for the convenience of the description. Alternative boundaries can be defined so long as the specified functions and relationships thereof are appropriately performed. Alternatives (including equivalents, extensions, variations, deviations, etc., of those described herein) will be apparent to persons skilled in the relevant art(s) based on the teachings contained herein. Such alternatives fall within the scope of the disclosed embodiments. Also, the words "comprising," "having," "containing," and "including," and other similar forms are intended to be equivalent in meaning and be open ended in that an item or items following any one of these words is not meant to be an exhaustive listing of such item or items, or meant to be limited to only the listed item or items. It must also be noted that as used herein and in the appended claims, the singular forms "a," "an," and "the" include plural references unless the context clearly dictates otherwise.

Furthermore, one or more computer-readable storage media may be utilized in implementing embodiments consistent with the present disclosure. A computer-readable storage medium refers to any type of physical memory on which information or data readable by a processor may be stored. Thus, a computer-readable storage medium may store instructions for execution by one or more processors, including instructions for causing the processor(s) to perform steps or stages consistent with the embodiments described herein. The term "computer-readable medium" should be understood to include tangible items and exclude carrier waves and transient signals, i.e., be non-transitory. Examples include random access memory (RAM), read-only memory (ROM), volatile memory, nonvolatile memory, hard drives, CD ROMs, DVDs, flash drives, disks, and any other known physical storage media.

It is intended that the disclosure and examples be considered as exemplary only, with a true scope of disclosed embodiments being indicated by the following claims.

What is claimed is:

1. A processor implemented method for real-time monitoring and optimizing the operation of connected oil and gas wells, the method comprising:

receiving, via one or more hardware processors, data related to each well of the connected oil and gas wells from a plurality of data sources;

preprocessing, via the one or more hardware processors, the received data;

soft sensing, via the one or more hardware processors, a set of process variables using the preprocessed data and a set of physics-based soft sensors and models;

combining, via the one or more hardware processors, the preprocessed data and the set of process variables to prepare an integrated data;

forecasting, in real-time, via the one or more hardware processors, a plurality of parameters related to each well of the plurality of connected oil and gas wells using a plurality of physics-guided well surveillance models and the integrated data, wherein the plurality of physics-guided well surveillance models is pre-generated offline, and wherein the plurality of parameters comprises:
  a flow rate of oil, gas and brine produced from each well in the connected oil and gas wells,
  a pressure, a temperature distribution and a velocity distribution in multiphase flow from each well of the connected oil and gas wells;

computing, via the one or more hardware processors, health of a plurality of assets of the connected oil and gas wells using the plurality of physics-guided well surveillance models, wherein the plurality of assets comprises one or more of choke control valves, and artificial lift equipment comprising of electrical submersible pumps, and progressive cavity pumps;

computing, via the one or more hardware processors, a planned plurality of parameters related to a production rate of each well using a plurality of physics-based well simulators, wherein the plurality of physics-based well simulators is pre-configured for the connected oil and gas wells;

monitoring, via the one or more hardware processors, the performance of the each well of the connected oil and gas wells to determine, if the forecasted production is in line with the planned production from each well of the connected oil and gas wells;

detecting, via the one or more hardware processors, a production drift based on the monitoring of the performance of the wells;

running, via the one or more hardware processors, real-time diagnostics to identify plausible root causes for the detected production drift using data-driven diagnostic models built using one or more machine learning techniques;

composing, via the one or more hardware processors, a well performance optimization problem, wherein the well performance optimization problem comprises of a plurality of operations objectives and constraints in accordance with identified plausible root causes of the detected production drift and the computed health of the plurality of assets of the connected oil and gas wells;

identifying, via the one or more hardware processors, a plurality of process settings for optimal operation of the connected oil and gas wells by solving the composed well performance optimization problem, wherein the plurality of process settings are identified for each well and include choke valve positions and set points for injectant systems, artificial lift systems and progressive capacity pump; and automatically implementing, in real time, via the one or more hardware processors, the plurality of process settings for optimal operation of the connected oil and gas wells, for closed-loop control of operation of the connected oil and gas wells.

2. The method in claim 1, wherein the plurality of physics-guided well surveillance models comprises of artificial neural network models incorporating the physics-based model equations of multiphase flow in oil and gas wells including saturation balance of each phase, capillary pressures, fluid flow laws, overall material balances of each phase and hydrocarbon balances.

3. The method in claim 1, wherein the physics-guided well surveillance models comprise of neural network architectures with one or more of the following configurations:

output of physics-based model equations used as inputs to a neural network model along with the data from the plurality of data sources;

the physics-based model equations used in a loss function of the neural network model as a regularization term; and outputs of the physics-based model equations and embeddings from a first neural network model used in a second neural network model.

4. The method of claim 1, further comprising monitoring and improving the accuracy of the physics-guided well surveillance models by:

computing, in real-time, a model quality index (MQI) using the forecasted values and actual measurements of the plurality of parameters of each well in a time window of a predetermined duration; and triggering self-learning of the physics-guided well surveillance models when the computed MQI values fall below a predetermined threshold, wherein self-learning comprises of re-training the models by:

tuning weights and hyperparameters in the physics-guided well surveillance models;

modifying the one or more machine learning techniques used in the physics-guided well surveillance models; and modifying features used in the physics-guided well surveillance models.

5. The method of claim 1, wherein monitoring the performance of the connected oil and gas wells is accomplished by computing a measure of deviation between the planned and forecasted flow rates of oil and gas using one or more statistical measures comprising one of a mean absolute error (MAE), a root mean square error (RMSE) and mean absolute percentage error (MAPE).

6. The method of claim 1, wherein plurality of data sources comprises a distributed control system (DCS), one or more of Supervisory Control and Data Acquisition (SCADA) System, Enterprise Resource Planning (ERP) system, a historian, a laboratory information management system (LIMS), Manufacturing Execution System (MES), Manufacturing Operations Management System (MOM) databases, a plurality of sensors, external sources, manual input, a well sensor database, a field test database, and a seismic and drilling database.

7. The method of claim 1, wherein data preprocessing comprises removing noise, outliers, and spurious values from the data, achieving a uniform sampling frequency, imputation of missing values in the data, and synchronization of data from multiple data sources by incorporating appropriate process and residence time lags.

8. The method of claim 1, wherein the well optimization problem is composed utilizing a pre-generated knowledge database.

9. The method of claim 1, wherein the plurality of operations objectives includes maximizing crude oil and gas production, minimizing injectant amounts, decreasing energy consumption and emissions, and improving an overall profitability of the connected oil and gas wells.

10. The method of claim 1, wherein the plurality of operations constraints includes market demand for oil and gas, transport limits, availability of wellheads, operational limits imposed by health of well assets and injectant system constraints.

11. A system for real-time monitoring and optimizing operation of connected oil and gas wells, the system comprises:

an input/output interface;

one or more hardware processors;

a memory in communication with the one or more hardware processors, wherein the one or more first hardware processors are configured to execute programmed instructions stored in the memory, to:

receive data related to each well of the connected oil and gas wells from a plurality of data sources;

preprocess the received data;

soft-sense a set of process variables using the preprocessed data and a set of physics-based soft sensors and models;

combine the preprocessed data and the set of process variables to prepare an integrated data;

forecast in real-time a plurality of parameters related to each well of the plurality of connected oil and gas wells using a plurality of physics-guided well surveillance models and the integrated data, wherein the plurality of physics-guided well surveillance models is pre-generated offline, and wherein the plurality of parameters comprises:

a flow rate of oil, gas and brine produced from each well in the connected oil and gas wells, a pressure, a temperature distribution and a velocity distribution in multiphase flow from each well of the connected oil and gas wells;

compute health of a plurality of assets of the connected oil and gas wells using the plurality of physics-guided well surveillance models, wherein the plurality of assets comprises one or more of choke control valves, and artificial lift equipment comprising of electrical submersible pumps, and progressive cavity pumps;

compute a planned plurality of parameters related to a production rate of each well using a plurality of physics-based well simulators, wherein the plurality of physics-based well simulators is pre-configured for the connected oil and gas wells;

monitor the performance of the each well of the connected oil and gas wells to determine, if the forecasted production is in line with the planned production from each well of the connected oil and gas wells;

detect in real-time a production drift based on the monitoring of the performance of the wells;

run real-time diagnostics to identify plausible root causes for the detected production drift using data-driven diagnostic models built using one or more machine learning techniques;

compose a well performance optimization problem, wherein the well performance optimization problem comprises of a plurality of operations objectives and constraints in accordance with identified plausible root causes of the detected drift and the computed health of the plurality of assets of the connected oil and gas wells; and identify a plurality of process settings for optimal operation of the connected oil and gas wells by solving the composed well performance optimization problem, wherein the plurality of process settings are identified for each well and include choke valve positions and set points for injectant systems, artificial lift systems and progressive capacity pump; and automatically implement, in real time, the plurality of process settings for optimal operation of the connected oil and gas wells, for closed-loop control of operation of the connected oil and gas wells.

12. The system of claim 11 further comprises a knowledge database to capture the knowledge derived from historical data as well as operations and maintenance knowledge available with operators, maintenance engineers, geologists and other experts to contextualize and make the activities of well performance monitoring, diagnostics and optimization knowledge-guided.

13. The system of claim 11, wherein the plurality of data sources comprises a distributed control system (DCS), one or more of Supervisory Control and Data Acquisition (SCADA) System, Enterprise Resource Planning (ERP) system, a historian, a laboratory information management system (LIMS), Manufacturing Execution System (MES), Manufacturing Operations Management System (MOM), databases, a plurality of sensors, external sources, manual input and other digital systems in the field.

14. One or more non-transitory machine-readable information storage mediums comprising one or more instructions which when executed by one or more hardware processors cause:

receiving, via the one or more hardware processors, data related to each well of the connected oil and gas wells from a plurality of data sources;

preprocessing, via the one or more hardware processors, the received data;

soft sensing, via the one or more hardware processors, a set of process variables using the preprocessed data and a set of physics-based soft sensors and models;

combining, via the one or more hardware processors, the preprocessed data and the set of process variables to prepare an integrated data;

forecasting, in real-time, via the one or more hardware processors, a plurality of parameters related to each well of the plurality of connected oil and gas wells using a plurality of physics-guided well surveillance models and the integrated data, wherein the plurality of physics-guided well surveillance models is pre-generated offline, and wherein the plurality of parameters comprises:

a flow rate of oil, gas and brine produced from each well in the connected oil and gas wells, a pressure, a temperature distribution and a velocity distribution in multiphase flow from each well of the connected oil and gas wells;

computing, via the one or more hardware processors, health of a plurality of assets of the connected oil and gas wells using the plurality of physics-guided well surveillance models;

computing, via the one or more hardware processors, a planned plurality of parameters related to a production rate of each well using a plurality of physics-based well simulators, wherein the plurality of physics-based well simulators is pre-configured for the connected oil and gas wells, wherein the plurality of assets comprises one or more of choke control valves, and artificial lift equipment comprising of electrical submersible pumps, and progressive cavity pumps;

monitoring, via the one or more hardware processors, the performance of the each well of the connected oil and gas wells to determine, if the forecasted production is in line with the planned production from each well of the connected oil and gas wells;

detecting, via the one or more hardware processors, a production drift based on the monitoring of the performance of the wells;

running, via the one or more hardware processors, real-time diagnostics to identify plausible root causes for the detected production drift using data-driven diagnostic models built using one or more machine learning techniques;

composing, via the one or more hardware processors, a well performance optimization problem, wherein the well performance optimization problem comprises of a plurality of operations objectives and constraints in accordance with identified plausible root causes of the detected production drift and the computed health of the plurality of assets of the connected oil and gas wells;

identifying, via the one or more hardware processors, a plurality of process settings for optimal operation of the connected oil and gas wells by solving the composed well performance optimization problem, wherein the plurality of process settings are identified for each well and include choke valve positions and set points for injectant systems, artificial lift systems and progressive capacity pump; and automatically implementing, in real time, via the one or more hardware processors, the plurality of process settings for optimal operation of the connected oil and gas wells, for closed-loop control of operation of the connected oil and gas wells.

* * * * *